US012805235B2

(12) United States Patent
Nagumo et al.

(10) Patent No.: US 12,805,235 B2
(45) Date of Patent: Nov. 17, 2026

(54) MANUFACTURING METHOD OF SEMICONDUCTOR DEVICE

(71) Applicants: DENSO CORPORATION, Kariya-city (JP); TOYOTA JIDOSHA KABUSHIKI KAISHA, Toyota (JP); MIRISE Technologies Corporation, Nisshin (JP); MITSUBOSHI DIAMOND INDUSTRIAL CO., LTD., Osaka (JP)

(72) Inventors: Yuji Nagumo, Nisshin (JP); Masashi Uecha, Nisshin (JP); Masaru Okuda, Nisshin (JP); Masatake Nagaya, Nisshin (JP); Mitsuru Kitaichi, Settsu-city (JP); Akira Mori, Settsu-city (JP); Naoya Kiyama, Settsu-city (JP); Masakazu Takeda, Settsu-city (JP)

(73) Assignees: DENSO CORPORATION, Kariya-city (JP); TOYOTA JIDOSHA KABUSHIKI KAISHA, Toyota (JP); MIRISE Technologies Corporation, Nisshin (JP); MITSUBOSHI DIAMOND INDUSTRIAL CO., LTD., Osaka (JP)

( * ) Notice: Subject to any disclaimer, the term of this patent is extended or adjusted under 35 U.S.C. 154(b) by 319 days.

(21) Appl. No.: 18/489,999

(22) Filed: Oct. 19, 2023

(65) Prior Publication Data

US 2024/0162092 A1 May 16, 2024

(30) Foreign Application Priority Data

Nov. 15, 2022 (JP) ................................ 2022-182569

(51) Int. Cl.
*H10P 58/00* (2026.01)
*H10P 14/40* (2026.01)

(52) U.S. Cl.
CPC ............ *H10P 58/00* (2026.01); *H10P 14/412* (2026.01)

(58) Field of Classification Search
CPC . H10D 89/013; H01L 21/32051; H01L 21/78; H01L 21/0475; H10P 58/00; H10P 14/412; H10P 54/00; H10P 50/00
See application file for complete search history.

(56) References Cited

U.S. PATENT DOCUMENTS

2019/0035684 A1 1/2019 Nagaya et al.
2020/0381302 A1* 12/2020 Murakami .............. H01L 21/78

FOREIGN PATENT DOCUMENTS

CN 109940294 A 6/2019
JP 2014-013812 A 1/2014

* cited by examiner

*Primary Examiner* — Jonathan Han
(74) *Attorney, Agent, or Firm* — Posz Law Group, PLC

(57) ABSTRACT

A manufacturing method of a semiconductor device includes: forming a plurality of element structures in a form of matrix on a first surface of a semiconductor wafer; forming a crack extending in a thickness direction of the semiconductor wafer along a boundary between the element structures adjacent to each other by pressing a pressing member against a second surface of the semiconductor wafer opposite to the first surface along the boundary; and dividing the semiconductor wafer along the boundary by pressing a dividing member against the semiconductor wafer on a first surface side along the boundary.

3 Claims, 5 Drawing Sheets

MANUFACTURING METHOD OF SEMICONDUCTOR DEVICE

CROSS REFERENCE TO RELATED APPLICATION

The present application claims the benefit of priority from Japanese Patent Application No. 2022-182569 filed on Nov. 15, 2022. The entire disclosures of the above application are incorporated herein by reference.

TECHNICAL FIELD

The present disclosure relates to a manufacturing method of a semiconductor device.

BACKGROUND

For example, a manufacturing method of a semiconductor device includes a process of dividing a semiconductor wafer formed with a plurality of element structures into pieces so that each of the pieces includes the element structure. As an example of the process of dividing a semiconductor wafer, a technique of cutting (e.g., dicing) the semiconductor wafer along a boundary between adjacent element structures has been known.

SUMMARY

The present disclosure describes a technique for manufacturing a semiconductor device with high reliability by using a scribing and breaking method. In an aspect of the present disclosure, a manufacturing method of a semiconductor device includes: forming a plurality of element structures in a form of matrix on a first surface of a semiconductor wafer; forming a crack extending in a thickness direction of the semiconductor wafer along a boundary between adjacent element structures by pressing a pressing member against a second surface of the semiconductor wafer along the boundary, the second surface being opposite to the first surface; and dividing the semiconductor wafer along the boundary by pressing a dividing member against the semiconductor wafer on a first surface side along the boundary.

BRIEF DESCRIPTION OF THE DRAWINGS

Objects, features and advantages of the present disclosure will become more apparent from the following detailed description made with reference to the accompanying drawings, in which like parts are designated by like reference numbers and in which.

DETAILED DESCRIPTION

Figure 1:
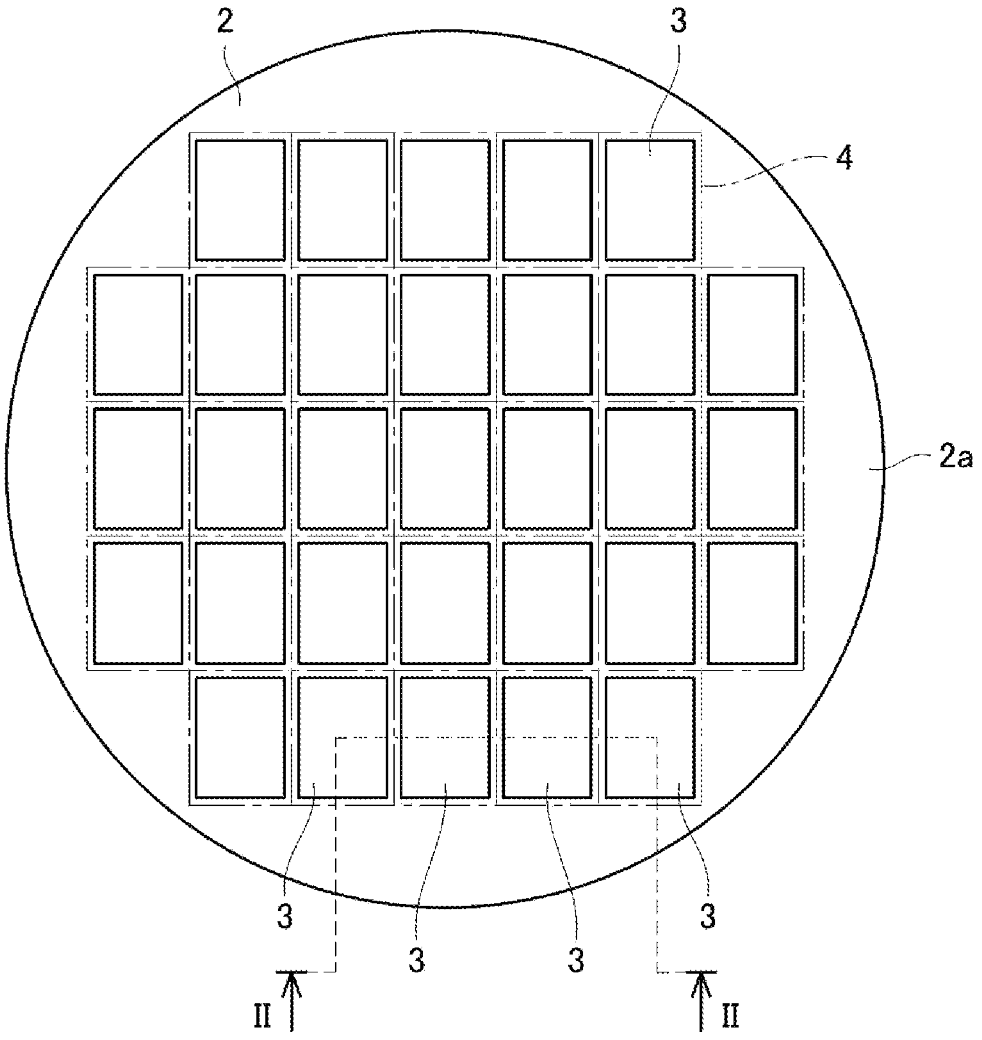
FIG. 1 is a diagram illustrating a plan view of a semiconductor wafer.

In recent years, a scribing and breaking method has begun to be adopted, in place of the dicing method. In the scribing and breaking method, first, a pressing member is pressed against a semiconductor wafer along a boundary between adjacent element structures to form a crack along the boundary in the semiconductor wafer. Next, a dividing member is pressed against the semiconductor wafer along the boundary to divide the semiconductor wafer along the boundary. In this scribing and breaking method, the semiconductor wafer is not divided by cutting. That is, the semiconductor wafer is divided by cleaving from the crack. Therefore, the scribing and breaking method is useful for a relatively hard material, and can reduce the width between adjacent element structures, as compared with the dicing method.

In the scribing and breaking method, the pressing member is pressed against the semiconductor wafer to generate stress inside the semiconductor wafer, thereby to form the crack. This stress exists as residual stress even after the semiconductor wafer is divided into pieces. Therefore, when a manufactured semiconductor device is repeatedly operated, chipping, unintended cracks, or the like may occur in the vicinity of a region where the residual stress exists. The chipping or the like results in degradation of the reliability of the semiconductor device.

The present disclosure provides a technique for manufacturing a semiconductor device with high reliability by using a scribing and breaking method.

According to an aspect of the present disclosure, a manufacturing method of a semiconductor device includes: forming a plurality of element structures in a form of matrix on a first surface of a semiconductor wafer; forming a crack extending in a thickness direction of the semiconductor wafer along a boundary between adjacent element structures by pressing a pressing member against a second surface of the semiconductor wafer along the boundary, the second surface being opposite to the first surface; and dividing the semiconductor wafer along the boundary by pressing a dividing member against the semiconductor wafer on a first surface side along the boundary.

In the manufacturing method according to the aspect, the element structures are formed in the form of matrix on the first surface of the semiconductor wafer, and the pressing member is pressed against the semiconductor wafer on the second surface side to apply a stress in a region adjacent to the second surface in the semiconductor wafer. Thus, a crack is formed in the region adjacent to the second surface in the semiconductor wafer. Thereafter, the semiconductor wafer is divided by pressing the dividing member against the semiconductor wafer on the first surface side. As a result, in the semiconductor device manufactured, the residual stress exists not in a region adjacent to the first surface on which the element structure is individually provided but in a region adjacent to the second surface opposite to the first surface. By the manufacturing method described above, the residual stress exists in the region adjacent to the second surface opposite to the first surface on which the element structure such as a trench or a gate electrode, which realizes the function of the semiconductor device, is formed. Therefore, even if chipping or the like occurs due to the residual stress, the performance of the semiconductor device is less likely to be affected. Accordingly, the manufacturing method described above can produce the semiconductor device with high reliability.

According to an aspect of the present disclosure, in the manufacturing method, the semiconductor wafer may be made of silicon carbide (SiC).

According to an aspect of the present disclosure, the manufacturing method may further include forming a metal layer on the second surface of the semiconductor wafer. The timing to perform the forming of the metal layer may not be particularly limited. For example, the forming of the metal layer may be performed before the forming of the crack. The forming of the metal layer may be performed between the forming of the crack and the dividing of the semiconductor wafer. The forming of the metal layer may be performed after the dividing of the semiconductor wafer.

Figure 2:
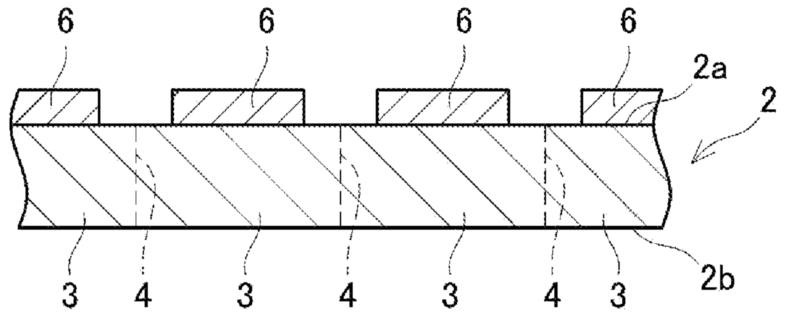
FIG. 2 is a diagram for explaining an element structure forming process.

As an embodiment of the present disclosure, a manufacturing method of a semiconductor device will be described hereinafter in detail with reference to the drawings. FIG. 1 is a plan view of a semiconductor wafer 2 in which multiple element regions 3 are arranged in a matrix. In FIG. 1, each of the element regions 3 is schematically illustrated by a solid line. The element region 3 is a region in which an element structure, such as a transistor or a diode, is formed on a first surface 2*a* of the semiconductor wafer 2. For convenience of description, lines that are boundaries between adjacent element regions 3 and are used when the semiconductor wafer 2 is divided into individual element regions 3 are referred to as planned dividing lines 4. The planned dividing lines 4 are not actually drawn on the semiconductor wafer 2, but are virtual lines. The planned dividing lines 4 may be lines or grooves actually drawn on the semiconductor wafer 2 so as to be visible. The semiconductor wafer is made of silicon carbide (SiC). Alternatively, the semiconductor wafer 2 may be made of another semiconductor material, such as silicon (Si) or gallium nitride (GaN). As shown in FIG. 2 and the like, the semiconductor wafer 2 has the first surface 2*a* and a second surface 2*b* opposite to the first surface 2*a* in a thickness direction of the semiconductor wafer 2.

The manufacturing method of the present embodiment includes an element structure forming process, a metal layer forming process, a crack forming process, and a dividing process.

<Element Structure Forming Process>

In the element structure forming process, as shown in FIG. 2, multiple element structures 6 are formed on the first surface 2*a* of the semiconductor wafer 2. The element structure 6 includes at least one of an electrode, an insulating film, an n-type region, and a p-type region, which are provided adjacent to the first surface 2*a*. The element structure 6 includes a structure, such as a trench or a gate electrode, for realizing a function of the semiconductor device. In the element structure forming process, the element structure 6 is formed for each of the element regions 3. As such, the element structures 6 are formed so as to be arranged in a matrix on the first surface 2*a* of the semiconductor wafer 2. In the element structure forming process, in addition to the element structures 6 on the first surface 2*a*, a structure (not shown) providing a function of a transistor or a diode is formed inside the semiconductor wafer 2 for each of the element regions 3. For example, in a case where the structure of a metal oxide semiconductor field effect transistor (MOSFET) is formed inside the semiconductor wafer 2, a source region and a body region are formed individually for each of the element structures 6 in a region exposed on the first surface 2*a*. On the other hand, a drain region is formed over substantially the entire region exposed on the second surface 2*b*. That is, the drain region is formed so as to extend over the multiple element regions 3 in a location exposed on the second surface 2*b*.

<Metal Layer Forming Process>

Figure 3:
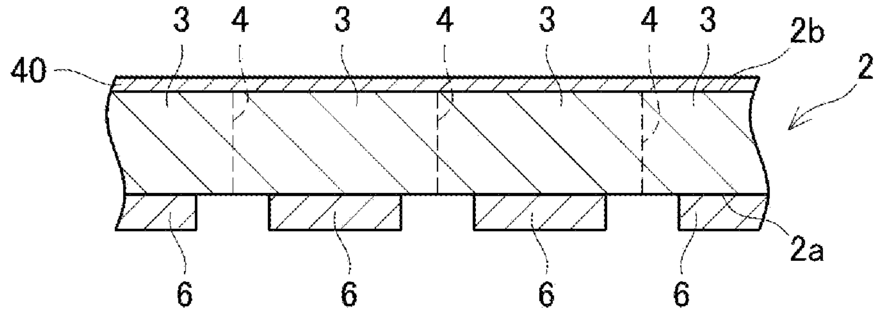
FIG. 3 is a diagram for explaining a metal film forming process.

Next, a metal layer forming process shown in FIG. 3 is performed. In FIG. 3, the semiconductor wafer 2 is illustrated with the second surface 2*b* side facing up. In the metal layer forming process, a metal layer 40 is formed on the second surface 2*b* of the semiconductor wafer 2. The metal layer 40 is made of, for example, titanium, nickel, gold, nickel silicide, or the like. The metal layer 40 is formed so as to cover substantially the entire region of the second surface 2*b*. That is, the metal layer 40 is formed on the second surface 2*b* so as to extend over the multiple element regions 3. The metal layer 40 functions as an electrode in the completed semiconductor device.

<Crack Forming Process>

Figure 4:
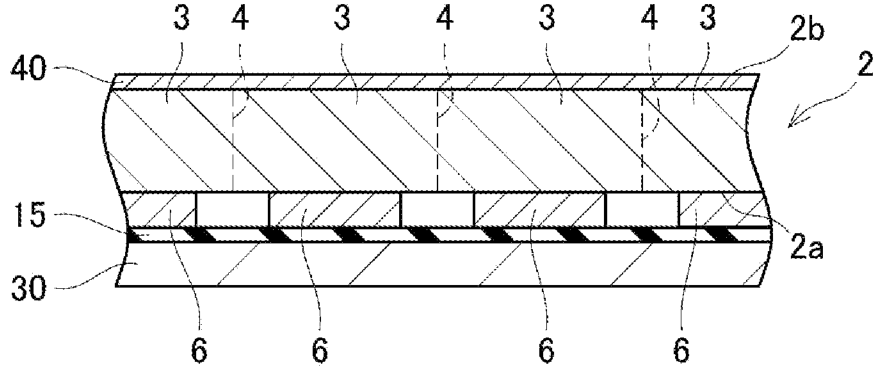
FIG. 4 is a diagram for explaining a crack forming process.
Figure 5:
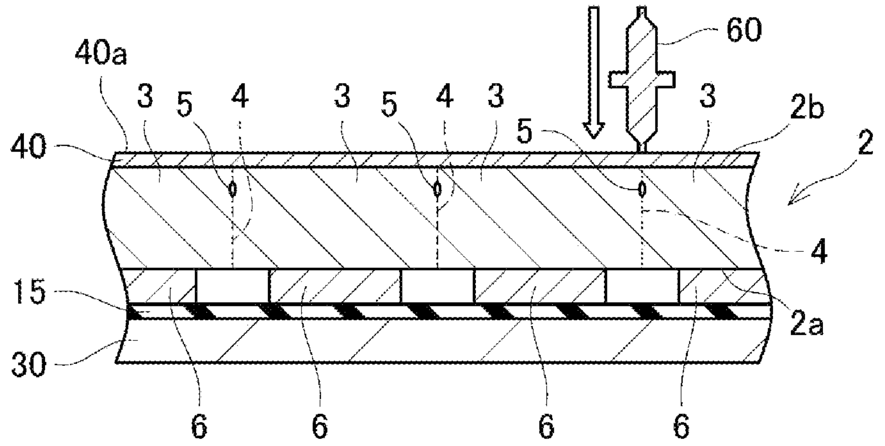
FIG. 5 is a diagram for explaining a crack forming process.

Next, a crack forming process shown in FIGS. 4 and 5 is performed. In the crack forming process, first, as shown in FIG. 4, a protective member 15 is attached so as to extend over the surfaces of the element structures 6, which have been formed in the respective element regions 3 of the semiconductor wafer 2. For example, the protective member 15 is made of a resin or the like. Next, the semiconductor wafer 2 is placed on a stage 30. In this case, the semiconductor wafer 2 is placed on the stage 30 so that the second surface 2*b* faces up, that is, the second surface 2*b* is opposite to the stage 30. The stage 30 has a vacuum suction device, which is not illustrated. Thus, the stage 30 can suck and fix the semiconductor wafer 2, in particular, the protective member 15 thereon.

Thereafter, as shown in FIG. 5, a scribing wheel 60 is pressed against a front surface 40*a* of the metal layer 40 to form a scribe line with a crack 5 in the semiconductor wafer 2. That is, the scribing wheel 60 is pressed against the semiconductor wafer 2 on the second surface 2*b* side, that is, in a direction toward the second surface 2*b* as shown by an arrow in FIG. 5. The scribing wheel 60 is a disk-shaped (e.g., circular-shaped) member, and is rotatably supported by a support apparatus (not shown). The scribing wheel 60 is moved (scanned) along the planned dividing lines 4 while being pressed against the front surface 40*a* of the metal layer 40. While moving along the planned dividing lines 4, the scribing wheel 60 rolls on the front surface 40*a* of the metal layer 40 like a tire rolling on a road surface. The scribing wheel 60 has a sharp peripheral edge, and forms lines, as scribe lines, at which the metal layer 40 is plastically deformed along the planned dividing lines 4 on the front surface 40*a* of the metal layer 40. When the front surface 40*a* of the metal layer 40 is pressed by the scribing wheel 60, compressive stress is generated in a surface layer region adjacent to the second surface 2*b* inside the semiconductor wafer 2 through the metal layer 40. While the scribe lines (i.e., the grooves) are formed at portions pressed by the scribing wheel 60, tensile stress is generated inside the semiconductor wafer 2 immediately below the region where compressive stress is generated. The tensile stress is generated in a direction away from the planned dividing lines 4 along the second surface 2*b* of the semiconductor wafer 2 immediately below the region where the compressive stress is generated. Due to this tensile stress, the crack 5 extending in the thickness direction of the semiconductor wafer 2 is formed inside the semiconductor wafer 2. In this case, since the scribing wheel 60 is moved along the planned dividing line 4 while being pressed against the front surface 40*a*, in a region adjacent to the second surface 2*b* of the semiconductor wafer 2, the crack 5 is formed to extend in the thickness direction of the semiconductor wafer 2 and along the boundary between the adjacent element regions 3 (i.e., the element structures 6). The crack 5 is formed in the vicinity of the surface layer of the second surface 2*b* of the semiconductor wafer 2. The scribing wheel 60 is an example of a pressing member.

<Dividing Process>

Figure 6:
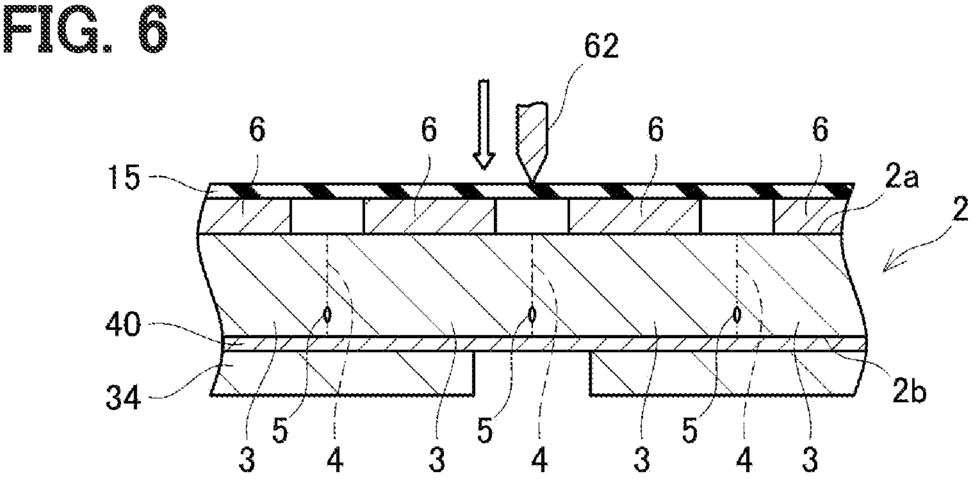
FIG. 6 is a diagram for explaining a dividing process.

Next, a dividing process shown in FIG. 6 is performed. In FIG. 6, the semiconductor wafer 2 is illustrated with the first surface 2*a* facing up again. In the dividing process, a breaking plate 62 is pressed along the planned dividing lines 4 (i.e., along the cracks 5 formed in the crack forming process) to divide the semiconductor wafer 2 along the planned dividing lines 4 (i.e., along the boundaries of the element structures 6). In this case, first, the semiconductor wafer 2 is placed on two support bases 34. The two support bases 34 are spaced apart from each other so as to have a gap therebetween. The semiconductor wafer 2 is placed on the support bases 34 so that the gap is located below a dividing position at which the semiconductor wafer 2 is to be divided, that is, the gap is located below a position to which the breaking plate 62 is pressed. Thereafter, the breaking plate 62 is pressed against the first surface 2*a* of the semiconductor wafer 2 across the protective member 15. The breaking plate 62 is a plate-shaped member, and a lower end of the breaking plate 62 (i.e., an edge pressed against the first surface 2*a*) has a ridgeline shape (i.e., a sharp edge). However, the breaking plate 62 is only pressed against the semiconductor wafer 2 so as not to cut the semiconductor wafer 2.

The support bases 34 are not present below the breaking plate 62. In other words, the gap between the two support bases 34 is located below the breaking plate 62. Therefore, when the breaking plate 62 is pressed against the first surface 2*a*, the semiconductor wafer 2 is bent so as to enter the gap between the two support bases 34. In this case, the crack 5 has been formed adjacent to the second surface 2*b* in the semiconductor wafer 2. Therefore, when the breaking plate 62 is pressed against the semiconductor wafer 2 on the first surface 2*a* side, that is, in a direction toward the first surface 2*a* as shown by an arrow in FIG. 6, the semiconductor wafer 2 is bent about the pressed portion (line). As such, in the region adjacent to the second surface 2*b*, a force is applied to the crack 5 in a direction in which the crack 5 expands so as to separate the two element regions 3 adjacent to each other across the crack 5 at the dividing position. As described above, the tensile stress is applied to the periphery of the crack 5. Therefore, when the breaking plate 62 is pressed against the first surface 2*a*, the crack 5 extends in the thickness direction of the semiconductor wafer 2, and the semiconductor wafer 2 is cleaved from the crack 5 along the crystal plane. As a result, the semiconductor wafer 2 is divided. In addition, since the metal layer 40 is formed on the second surface 2*b* of the semiconductor wafer 2, a force is also applied to the metal layer 40 in a direction in which the two element regions 3 adjacent to each other at the dividing position are separated. As such, the metal layer 40 is deformed so as to be separated and is thus divided. Instead of the two support bases 34, the entirety of the second surface 2*b* of the semiconductor wafer 2 may be supported by one elastic support plate, or may be supported by one or more support bases across one elastic support plate. In such cases, although the elastic support plate is present below the breaking plate 62, when the semiconductor wafer 2 is bent, the elastic support plate is deformed in accordance with the bending of the semiconductor wafer 2. Therefore, when the breaking plate 62 is pressed against the first surface 2*a*, a force is applied to the crack 5 in a direction in which the crack 5 expands so as to separate the two adjacent element regions 3 at the dividing position, similarly to the case in which the semiconductor wafer 2 is supported by the two support bases 34 (i.e., the case in which the support bases 34 are not present below the breaking plate 62). The breaking plate 62 is an example of a dividing member.

Figure 7:
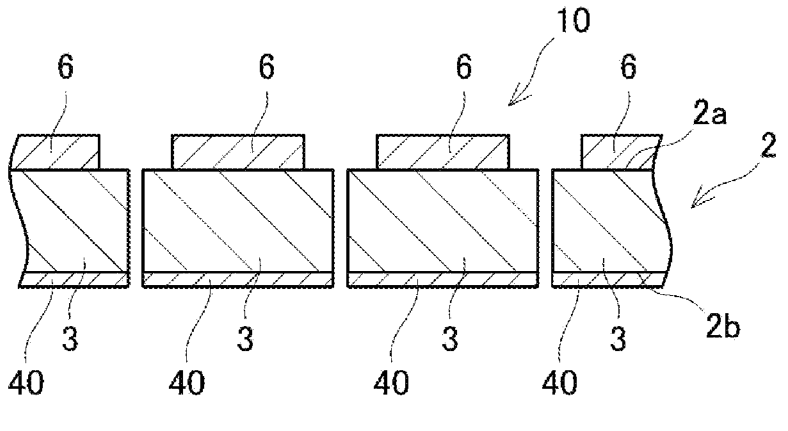
FIG. 7 is a diagram illustrating multiple divided semiconductor devices.

In the dividing process, the process of pressing the breaking plate 62 against the first surface 2*a* is repeatedly performed along each of the planned dividing lines 4. Accordingly, the semiconductor wafer 2 and the metal layer 40 can be divided along the boundaries between the element regions 3. As a result, as shown in FIG. 7, the semiconductor wafer 2 is divided into multiple semiconductor devices 10. In this way, the multiple semiconductor devices 10 each formed with the element structure 6 and the metal layer 40 (i.e., a back surface electrode) can be obtained.

As described above, the semiconductor device 10 is manufactured by forming the crack 5 using the scribing wheel 60 and by dividing the semiconductor wafer 2 using the breaking plate 62. In the present embodiment, the semiconductor wafer 2 is divided by cleaving from the crack, rather than by cutting (e.g., dicing). This technique is useful for SiC, which is relatively hard. Also, in the manufacturing method of the present embodiment, the width between adjacent element structures 6 can be made narrower than that in the dicing method.

Figure 8:
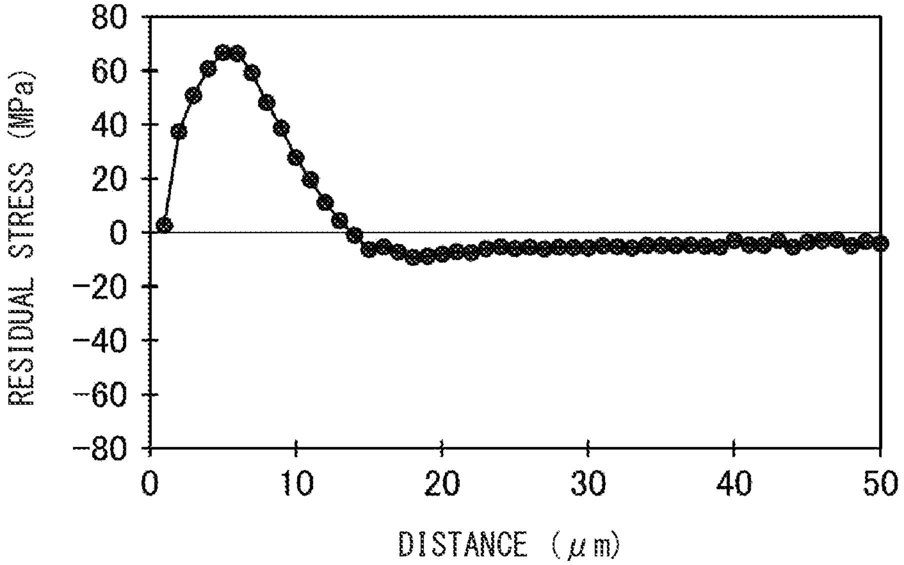
FIG. 8 is a graph illustrating a residual stress existing in the vicinity of a crack after a semiconductor wafer is divided along the crack with respect to a distance that is measured from a divided surface in a direction perpendicular to the divided surface.
Figure 9:
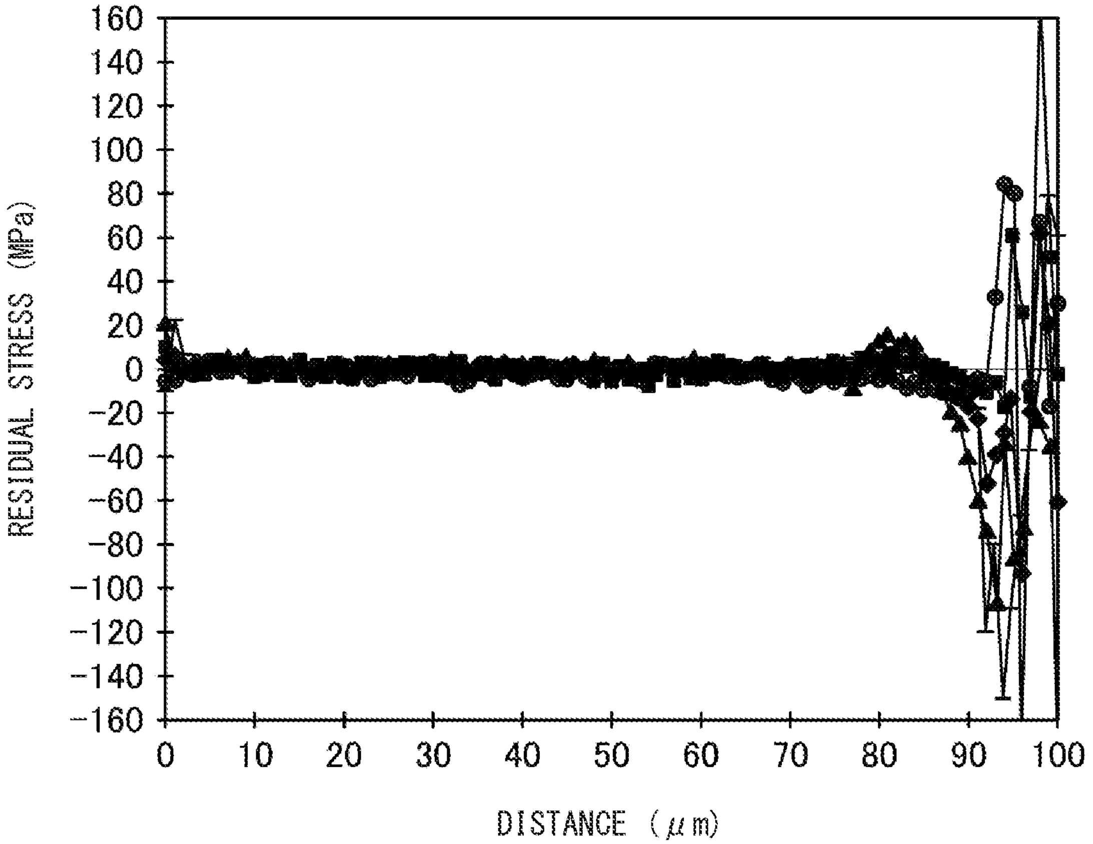
FIG. 9 is a graph illustrating the residual stress inside the semiconductor wafer with respect to a distance that is measured from the first surface toward the second surface in a thickness direction of the semiconductor wafer.

As described above, when the scribing wheel 60 is pressed against the semiconductor wafer 2 to form the crack 5 in the semiconductor wafer 2, the stress is generated inside the semiconductor wafer 2. This stress remains in the semiconductor wafer 2 as residual stress even after the semiconductor wafer 2 is divided. FIG. 8 is a graph showing a residual stress existing in the vicinity of a crack (i.e., at a depth of about 1 μm from the surface pressed by the scribing wheel) after a semiconductor wafer is divided along the crack by the scribing and breaking method, the residual stress being measured from the divided surface along a direction perpendicular to the divided surface. In FIG. 8, the horizontal axis represents a distance from the divided surface (i.e., the distance from the surface against which the scribing wheel is pressed), and the vertical axis represents the value of the residual stress. In FIG. 8 and FIG. 9, which will be described later, the positive value of the residual stress indicates the tensile stress, and the negative value of the residual stress indicates the compressive stress. As shown in FIG. 8, there exists a large residual stress in the vicinity of the division surface (i.e., in the vicinity of the crack 5 shown in FIG. 5 and the like). Therefore, when the manufactured semiconductor device 10 is repeatedly operated, the vicinity of the region where the residual stress exists is likely to receives a load, and chipping or the like is likely to occur as compared with the other regions.

However, in the manufacturing method of the present embodiment, since the element structure 6 is formed on the first surface 2*a* of the semiconductor wafer 2, and the scribing wheel 60 is pressed against the semiconductor wafer 2 on the second surface 2*b* side. Therefore, the stress is applied to and the crack 5 is formed in the region adjacent to the second surface 2*b*. Thereafter, the semiconductor wafer 2 is divided by pressing the breaking plate 62 against the semiconductor wafer 2 on the first surface 2*a* side. As a result, in the semiconductor device 10 manufactured, the residual stress is present not in a region adjacent to the first surface 2*a* on which the element structure 6 is individually provided but in the region adjacent to the second surface 2*b* opposite to the element structure 6.

FIG. 9 is a graph showing the residual stress inside the semiconductor wafer 2 when measured in the thickness direction from the first surface 2*a* toward the second surface 2*b*. As shown in FIG. 9, there exists a large residual stress adjacent to the second surface 2*b* (i.e., in the vicinity at a distance of 100 μm), whereas there is almost no residual stress adjacent to the first surface 2*a* (i.e., in the vicinity at a distance of 0 μm). As described above, in the manufacturing method of the present embodiment, the residual stress exists adjacent to the second surface 2*b* located on the opposite side to the first surface 2*a* formed with the element structure 6, such as a trench or a gate electrode, which realizes the function of the semiconductor device 10. Therefore, even if chipping or the like occurs due to the residual stress, the performance of the semiconductor device 10 is less likely to be affected. Therefore, in the manufacturing method of the present embodiment, the semiconductor device 10 having high reliability can be manufactured.

While only the selected exemplary embodiment and examples have been chosen to illustrate the present disclosure, it will be apparent to those skilled in the art from this disclosure that various changes and modifications can be made therein without departing from the scope of the disclosure as defined in the appended claims. Furthermore, the foregoing description of the exemplary embodiment and examples according to the present disclosure is provided for illustration only, and not for the purpose of limiting the disclosure as defined by the appended claims and their equivalents.

What is claimed is:

1. A manufacturing method of a semiconductor device, comprising:

forming a metal layer on a second surface of the semiconductor wafer, the second surface being opposite to a first surface in a thickness direction of the semiconductor wafer;

forming a crack extending in the thickness direction along a boundary between the element structures adjacent to each other by pressing a pressing member against the second surface of the semiconductor wafer across the metal layer along the boundary; and after the forming of the crack, dividing the semiconductor wafer along the boundary by pressing a dividing member against the semiconductor wafer on a first surface side along the boundary, wherein in the forming of the crack, the pressing member is pressed against the second surface of the semiconductor wafer across the metal layer such that the metal layer is plastically deformed, and in the dividing of the semiconductor wafer, the dividing member is pressed against the semiconductor wafer such that the metal layer is deformed so as to be separated and is thus divided.

2. The manufacturing method according to claim 1, wherein the semiconductor wafer is made of silicon carbide.

3. The manufacturing method according to claim 1, wherein in the forming of the crack, the pressing member is pressed against the second surface of the semiconductor wafer across the metal layer such that the metal layer is plastically deformed without being separated.

* * * * *